US006184747B1

(12) United States Patent
Helgeson et al.

(10) Patent No.: US 6,184,747 B1
(45) Date of Patent: Feb. 6, 2001

(54) DIFFERENTIAL FILTER WITH GYRATOR

(75) Inventors: Michael A. Helgeson, Eagan; Keith R. Maile, Saint Paul, both of MN (US)

(73) Assignee: Honeywell International Inc., Morristown, NJ (US)

(*) Notice: Under 35 U.S.C. 154(b), the term of this patent shall be extended for 0 days.

(21) Appl. No.: 09/311,105

(22) Filed: May 13, 1999

(51) Int. Cl.[7] .................................................. H03B 1/00

(52) U.S. Cl. .................................................... 327/552

(58) Field of Search ................................ 327/551, 552, 327/553, 555, 556, 557, 558, 559; 330/303, 306; 455/307, 213

(56) References Cited

U.S. PATENT DOCUMENTS

| 3,643,183 | 2/1972 | Geffe ................................ 333/80 R |
| 3,715,693 | 2/1973 | Fletcher et al. .................... 333/80 T |
| 3,758,885 | 9/1973 | Voorman et al. .................. 333/80 T |
| 4,264,874 | 4/1981 | Young ................................. 330/277 |
| 4,529,947 | 7/1985 | Biard et al. ......................... 330/259 |
| 4,812,785 | 3/1989 | Pauker ........................... 331/117 FE |
| 5,371,475 | * 12/1994 | Brown .................................. 330/254 |
| 5,392,003 | 2/1995 | Nag et al. ............................ 330/254 |
| 5,424,675 | * 6/1995 | Matsushita .......................... 327/558 |
| 5,430,409 | 7/1995 | Buck et al. ............................. 330/2 |
| 5,451,898 | 9/1995 | Johnson ............................... 327/563 |
| 5,642,071 | 6/1997 | Sevenhans et al. ................. 327/359 |
| 5,697,093 | * 12/1997 | Cusdin et al. ....................... 455/324 |
| 5,699,016 | * 12/1997 | Federspiel et al. .................. 330/260 |
| 5,726,603 | 3/1998 | Chawla et al. ...................... 330/269 |
| 5,767,664 | 6/1998 | Price ................................... 323/987 |
| 5,809,053 | 9/1998 | Kackman ............................ 370/253 |
| 5,815,051 | * 9/1998 | Hamasaki et al. .................. 333/172 |
| 5,847,623 | 12/1998 | Hadjichristos ..................... 332/105 |

OTHER PUBLICATIONS

Rofougaran et al., "A 999 MHz CMOS RF Power Amplifier with Programmable Output Power", Proceedings VLSI Circuits Symposium, Honolulu, Jun. 1994, pp. 133–134.

Rofougaran et al., "A 1 GHz CMOS RF Front–End IC for a Direct–Conversin Wireless Receiver", IEEE Journal of Solid–State Circuits, vol. 31, Jul. 1996, pp. 880–889.

Image–Rejection in Mixers, copyright AAA, 1996.

Wilson et al., "A Single–Chip VHF and UHF Receiver for Radio Paging", *IEEE Journal of Solid State Circuits*, vol. 26, No. 12, Dec. 1991, pp. 1945–1950.

Crols et al., "CMOS Wireless Transceiver Design", Kluwer Academic Publishers, 1997, pp. 17–23.

Chang et al., "A CMOS Channel–Select Filter for a Direct–Conversion Wireless Receiver", to appear in *IEEE Journal of Solid–State Circuits*, Apr. 1999.

Asad A. Abidi, "Direct–Conversion Radio Transceivers for Digital Communications", *IEEE Journal of Solid–State Circuits*, vol. 30, No. 12, Dec. 1995, pp. 1399–1410.

(List continued on next page.)

*Primary Examiner*—My-Trang Nuton
(74) *Attorney, Agent, or Firm*—John G. Shudy, Jr.

(57) ABSTRACT

A differential gyrator based filter is disclosed that preferably has a first gyrator connected to the positive input signal of the differential input signal and a second gyrator connected to the negative input signal of the differential input signal. A load capacitor is connected between the load terminals of the first gyrator and second gyrator, which minimizes the total load capacitance required for the gyrator based filter. This implementation is believed to increase the overall density, reliability, yield, signal-to-noise ratio and dynamic range of the gyrator based filter and related circuitry.

29 Claims, 10 Drawing Sheets

OTHER PUBLICATIONS

Behzad Razavi, "Design Considerations for Direct–Conversion Receivers", *IEEE Transactions on Circuits and Systems—II: Analog and Digital Signal Processing*, vol. 44, No. 6, Jun. 1997, pp. 428–435.

Thomas H. Lee, "The Design of COMS Radio–Frequency Integrated Circuits", Cambridge University Press, 1998, pp. 344–351.

Product Specification for Advanced Pager Receiver UAA2082, Integrated Circuits, Jan. 16, 1996.

Moulding et al., "Gyrator Video Filter IC with Automatic Tuning", *IEEE Journal of Solid–State Circuits*, vol. SC15, No. 6, Dec. 1980, pp. 963–868.

* cited by examiner

DIFFERENTIAL FILTER WITH GYRATOR

CROSS REFERENCE TO CO-PENDING APPLICATIONS

The present application is related to U.S. patent application Ser. No. 09/311,242 filed May 13, 1999 entitled "Output Buffer With Independently Controllable Current Mirror Legs"; U.S. patent application Ser. No. 09/311,246 filed May 13, 1999 entitled "Filter With Controlled Offsets For Active Filter Selectivity And DC Offset Control"; U.S. patent application Ser. No. 09/311,234 filed May 13, 1999 entitled "Compensation Mechanism For Compensating Bias Levels Of An Operation Circuit In Response To Supply Voltage Changes"; U.S. patent application Ser. No. 09/311,092 filed May 13, 1999 entitled "State Validation Using Bi-Directional Wireless Link"; U.S. patent application Ser. No. 09/311,250 filed May 13, 1999 entitled "Wireless System With Variable Learned-In Transmit Power"; and U.S. patent application Ser. No. 09/311,014 filed May 13, 1999 entitled "Wireless Control Network With Scheduled Time Slots", all of which are assigned to the assignee of the present invention and incorporated herein by reference.

BACKGROUND OF THE INVENTION

This invention relates to filters, and more particularly, to continuous differential filters that use gyrators or the like to simulate one or more inductance values. Most electrical systems include at least some form of an electrical filter such as a low pass, a high pass, or a bandpass filter. These filters are typically implemented using a combination of discrete components such as resistors, inductors and/or capacitors. In some technologies, such as integrated circuit and some printed circuit board technologies, inductors cannot readily be produced. To overcome this limitation, gyrators have been developed. Gyrators simulate an inductance using, for example, only active elements such as transistors and a capacitance load. Gyrators thus help eliminate the need for conventional physical inductors (e.g., coils).

Gyrators often have an input impedance that is proportional to the load admittance. Therefore, when a gyrator is loaded with a capacitance, the input impedance behaves like an inductance. Some prior art gyrator circuits are described in, for example, U.S. Pat. No. 3,643,183 to Geffe, U.S. Pat. No. 3,715,693 to Fletcher et al., U.S. Pat. No. 3,758,885 to Voorman et al., and U.S. Pat. No. 4,812,785 to Pauker.

In integrated circuit technologies, the load capacitance used by the gyrator is typically formed using a gate oxide type capacitor. Gate oxide capacitors include a gate oxide layer cladded by the substrate layer and the polysilicon gate layer. The capacitance value of a gate oxide capacitor is primarily dictated by the area of the polysilicon gate region. Even though the gate oxide layer is relatively thin, the amount of capacitance that can be generated per unit area is relatively small. Therefore, to generate an adequate capacitance value for many filter applications, the area of the gate oxide capacitor must be relatively large, which can significantly reduce the overall density, reliability and yield of the integrated circuit (IC).

In many integrated circuit processes, the gate oxide layer may be susceptible to pin holing, wherein one or more pinhole defects in the gate oxide effectively short the substrate to the polysilicon gate layer. The probability of having a pin hole in any given circuit is typically dependent on the total gate oxide area in the circuit. Thus, when large gate oxide capacitors are used, the chance of having one or more pin holes in the circuit increases, and the overall yield of the circuit decreases. Therefore, it would be desirable to produce a gyrator based filter circuit that minimizes the total area of the gate oxide capacitors.

Gyrator filters are also often only adapted to accept and filter single ended input signals. For some applications, it would be desirable to provide a gyrator based filter that is adapted to accept and filter differential input signals. Differential input signals typically provide an improved signal-to-noise ratio relative to a single ended input signal, and can increase the dynamic range of the circuit. This is particularly important for low power applications where the peak-to-peak signal level is relatively small, and when the gyrator circuit is integrated on a single IC along with other circuits that generate substantial substrate and power supply noise. Therefore, it would also be desirable to provide a gyrator based filter that is adapted for receiving and filtering a differential input signal.

SUMMARY OF THE INVENTION

The present invention overcomes many of the disadvantages of the prior art by providing a gyrator based filter that is adapted to receive and filter a differential input signal. The differential gyrator filter preferably includes a first gyrator connected to the positive input signal of the differential input signal and a second gyrator connected to the negative input signal of the differential input signal. A load capacitor is connected between the load terminals of the first gyrator and second gyrator, which minimizes the total load capacitance required for the gyrator based filter. This implementation is believed to increase the overall density, reliability, yield, signal-to-noise ratio and dynamic range of the gyrator based filter and related circuitry.

In one illustrative embodiment, the differential gyrator based filter includes a positive filter input terminal and a negative filter input terminal for receiving the positive input signal and the negative input signal, respectively, of the differential input signal. The positive filter input terminal is coupled to a first gyrator and the negative filter input terminal is coupled to a second gyrator. A load capacitor is then connected between the load terminal of the first gyrator and the load terminal of the second gyrator. By connecting the load capacitor between gyrators, rather than providing a separate capacitor from each gyrator to ground, the overall capacitor area is reduced. This may reduce the overall die area, increase the overall yield, reduce the manufacturing and test costs associated with each device, and provide a number of other advantages.

The first gyrator may include a first differential amplifier and a second differential amplifier. Likewise, the second gyrator may include a first differential amplifier and a second differential amplifier. The first differential amplifier and the second differential amplifier of each gyrator preferably has a positive input terminal, a negative input terminal, a positive output terminal and a negative output terminal.

The positive input terminal of the first differential amplifier of the first gyrator and the negative output terminal of the second differential amplifier of the first gyrator are preferably coupled to the input terminal of the first gyrator. The negative input terminal of the first differential amplifier of the first gyrator is preferably coupled to the positive output terminal of the second differential amplifier of the first gyrator. Likewise, the positive output terminal of the first differential amplifier of the first gyrator is preferably coupled to the positive input terminal of the second differential amplifier of the first gyrator. Finally, the negative output terminal of the first differential amplifier of the first gyrator is preferably coupled to the negative input terminal of the second differential amplifier of the first gyrator. The second gyrator is preferably similarly constructed.

Because the first and second gyrators are formed using two fully differential amplifiers, each gyrator may have two separate load terminals. To balance the load on each of the load terminals, the load capacitance preferably includes matched first and second capacitor loads, each having a first terminal and a second terminal. The positive output terminal of the first differential amplifier of the first gyrator and the positive input terminal of the second differential amplifier of the first gyrator are preferably coupled to the first terminal of the first capacitor. The negative output terminal of the first differential amplifier of the first gyrator and the negative input terminal of the second differential amplifier of the first gyrator are preferably coupled to the first terminal of the second capacitor. Likewise, the positive output terminal of the first differential amplifier of the second gyrator and the positive input terminal of the second differential amplifier of the second gyrator are preferably coupled to the second terminal of the first capacitor. Finally, the negative output terminal of the first differential amplifier of the second gyrator and the negative input terminal of the second differential amplifier of the second gyrator are preferably coupled to the second terminal of the second capacitor.

It is contemplated that the above differential gyrator circuit may be used in conjunction with other impedance elements such as capacitors and resistors to form a desired filter. In one illustrative embodiment, a first filter capacitor may be connected in parallel with the first gyrator to form a parallel LC network. Likewise, a second filter capacitor may be connected in parallel with the second gyrator to form another parallel LC network. A third filter capacitor may be connected between the input or output terminals of the first gyrator and the second gyrator. This configuration provides a low pass filter. To improve the quality of the filter, it is contemplated that a number of the above gyrator based filter stages may be cascaded together, with each filter stage providing one or more filter poles. Preferably, the overall gyrator filter may have sufficient filter stages to provide a 7-pole elliptic low-pass filter.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

The present invention provides a gyrator based filter that is adapted to receive and filter a differential input signal. This is preferably accomplished by providing a first gyrator connected to the positive input signal of the differential input signal and a second gyrator connected to the negative input signal of the differential input signal. A load capacitor is connected between the load terminals of the first gyrator and second gyrator, which minimizes the total load capacitance required for the gyrator based filter. This implementation is believed to increase the overall density, reliability, yield, signal-to-noise ratio and dynamic range of the gyrator based filter and related circuitry.

Figure 1:
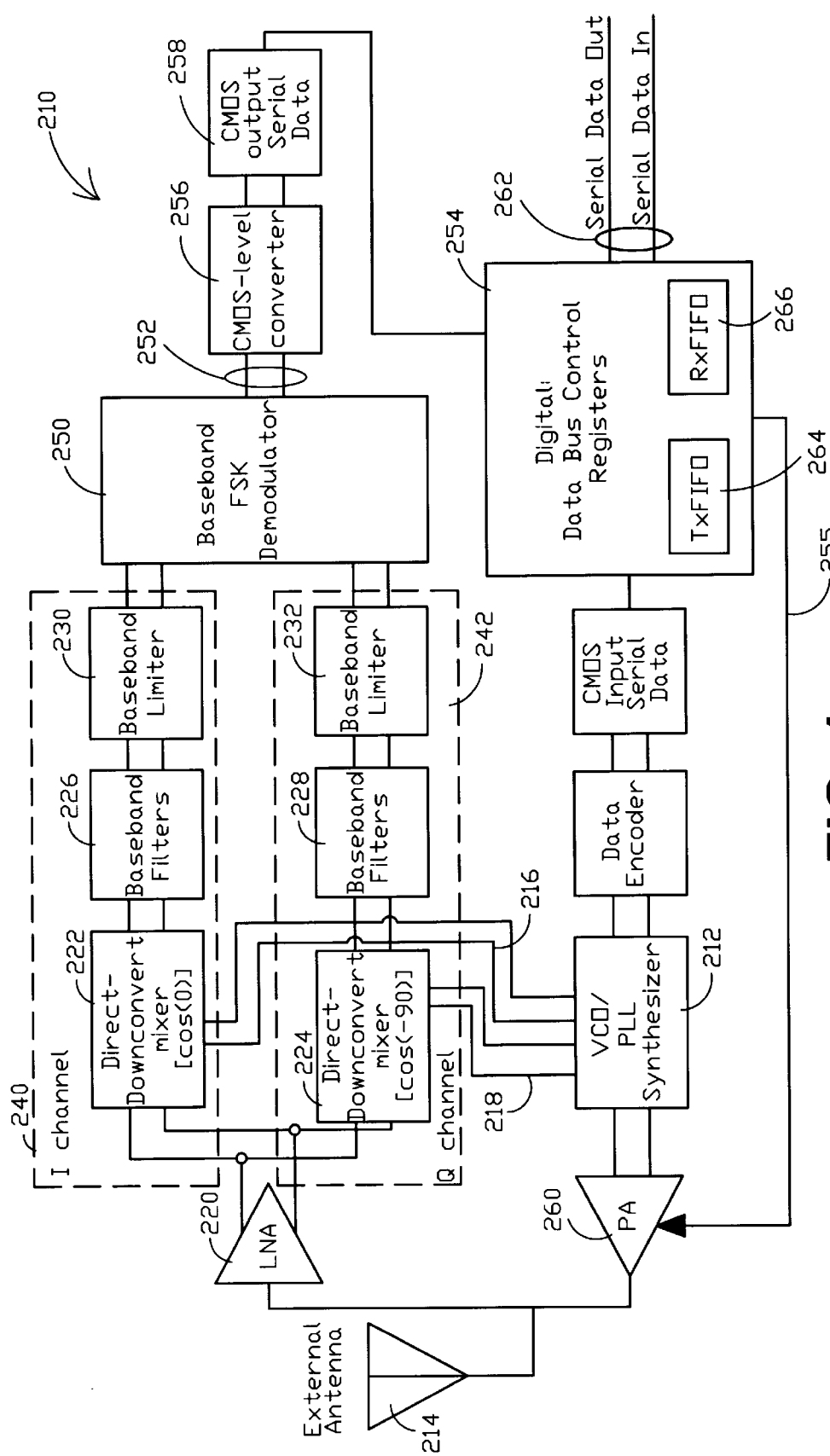
FIG. 1 is a block diagram of an integrated Direct Down Conversion Narrowband FSK Transceiver incorporating the present invention.

FIG. 1 is a block diagram of an integrated direct down conversion Narrowband FSK Transceiver 210 that incorporates the present invention. The Narrow Band FSK Transceiver 210 includes both transmit and receive functions, preferably on a single substrate with minimal use of external components. In use, the Narrow Band FSK Transceiver 210 provides a half-duplex transceiver radio data link capable of statistical frequency-spread transmissions.

Two or more Narrow Band Transceivers 210 can be used to form a wireless data communication network. Because each Narrowband FSK Transceiver 210 includes both transmit and receive functions, bi-directional transmission is possible. Bi-directional transmission allows data transfers to be confirmed, thereby increasing the reliability of the link to near 100 percent, depending on the access control algorithm implemented by the user.

The basic architecture of the Narrowband FSK Transceiver 210 is shown in FIG. 1. Off-chip components may include a crystal (which can be shared with an applications microprocessor), front end LC matching and filtering components, LC circuits for tuning the Phase Lock Loop (PLL)/Voltage Controlled Oscillator (VCO) 212, some external capacitors for filtering supply noise, a printed circuit board (PCB), an antenna 214 and a power source. The single chip Narrowband FSK Transceiver 210 is intended for the 418 MHz, 434.92 MHz, 868–870 MHz, and 902–928 MHz frequency bands.

The receiver design is based on the direct down conversion principle which mixes the input signal directly down to the baseband using a local oscillator at the carrier frequency. The direct down conversion principle is discussed in "Design Considerations for Direct-Conversion Receivers", by Behzad Rasavi, IEEE Transactions On Circuits and Systems—II; Analog and Digital Signal Processing, Vol. 44, No. 6, June 1997. In a direct down conversion alogrithm, two complete signal paths are provided including an I-channel 240 and a Q-channel 242, where the Q-channel 242 has a 90 degree phase shift relative to the I-channel 240. The I-channel 240 and the Q-channel 242 are used to demodulate the received signal.

Accordingly, the received signal is first provided to a low noise amplifier (LNA) 220. The LNA 220 preferably includes a compensation circuit that actively compensates selected bias levels within the LNA 220 in response to variations in the supply voltage, as more fully described in U.S. patent application Ser. No. 09/311,234 filed May 13, 1999 entitled "Compensation Mechanism For Compensating Bias Levels Of An Operation Circuit In Response To Supply Voltage Changes", which has been incorporated herein by reference. LNA 220 differentially drives a quadrature mixer pair 222 and 224. As indicated above, the input signal provided to mixer 224 is phase shifted 90 degrees relative to the input signal provided to mixer 222.

The PLL synthesizer/(VCO) 212 provides local oscillator (LO) signals in phase quadrature to mixers 222 and 224 via interfaces 216 and 218, respectively. Mixer 222 mixes the non-phase shifted the LO signal with the input signal, while Mixer 224 mixes the 90 degree phase shifted LO signal with the same input signal. In accordance with the present invention, mixers 222 and 224 also preferably include a compensation circuit that actively compensates selected bias levels in response to variations in supply voltage, as more fully described in U.S. patent application Ser. No. 09/311,234 filed May 13, 1999 entitled "Compensation Mechanism For Compensating Bias Levels Of An Operation Circuit In Response To Supply Voltage Changes", which has been incorporated herein by reference.

The differential outputs of mixer 222 and mixer 224 are provided down two identical signal channels in quadrature phase: the I-channel 240 and the Q-channel 242. I-channel 240 includes baseband filter block 226, and Q-channel 242 includes baseband filter block 228. Each baseband filter block may include a single pole low pass filter, followed by a second order filter (with two near-DC high-pass poles and two wideband low-pass poles), and a gyrator filter. The main channel filter of each baseband filter block is the gyrator filter, which preferably includes a gyrator-capacitor implementation of a 7-pole elliptic low-pass filter. I-channel 240 may also include limiter block 230, and Q-channel 42 may include limiter block 232. Limiter blocks 230 and 232 preferably limit the amplitudes of the corresponding signals to remove the amplitude information before the signals are provided to the demodulator 250. At least one of the limiter blocks 230 and 232 may contain an RSSI (Receive Signal Strength Indicator) output that can be used for Forward-and-Reverse link power management for DSSS applications or for demodulating FSK (Frequency Shift Key), ASK (Amplitude Shift Key), OOK (On Off Key), or any other modulation technique. One such power management approach is described in U.S. patent application Ser. No. 09/311,250 filed May 13, 1999 entitled "Wireless System With Variable Learned-in Transmit Power". The RSSI signal may also be used by AFC (Automatic Frequency Control frequency tracking) or AGC (Automatic Gain Control dynamic range enhancement), or both.

The demodulator 250 combines and demodulates the I- and Q-channel outputs to produce a digital data output 252. In doing so, the demodulator 250 detects the relative phase difference between the I- and Q-channel signals. If the I-channel signal leads the Q-channel signal, the FSK tone frequency lies above the tone frequency, indicating a data '1' state. If the I-channel signal lags the Q-channel signal, the FSK tone frequency lies below the tone frequency, indicating a data '0' state. The digitized output 252 of the receiver is provided to Control block 254 via CMOS-level converter 256 and CMOS Output Serial Data block 258.

The transmitter of the Narrowband FSK Transceiver 210 includes a PLL frequency synthesizer and a power amplifier 260. A preferred implementation of power amplifier 260 is shown and described in co-pending U.S. patent application Ser. No. 09/311,242 filed May 13, 1999 entitled "Output Buffer With Independently Controllable Current Mirror Legs". The frequency synthesizer may include a voltage-controlled oscillator (VCO) 212, a crystal oscillator, a prescaler, a number of programmable frequency dividers, and a phase detector. A loop filter may also be provided external to the chip for flexibility, which may be a simple passive circuit. The VCO 212 preferably provides one or more on-chip varactors. In one embodiment, the VCO 212 includes a high tune sensitivity varactor for wideband modulation and a low tune sensitivity varactor for narrowband modulation. The modulation varactor that is chosen depends on the particular application. The modulation varactors are used to modulate a serial data stream onto a selected carrier frequency. The modulated signal is provided to the power amplifier 260, which drives the external antenna 214.

Preferably, the output power level of the power amplifier 260 can be controlled by Control block 254 via interface 255. This allows a transmitting Narrowband FSK Transceiver 210 to transmit a signal at a relatively low power level to conserve system power. If an acknowledge is received from a receiving Narrowband FSK Transceiver, the transmission is complete. If an acknowledge is not received, however, the transmitting Narrowband FSK Transceiver may increase the power level of the power amplifier 260. If an acknowledge is still not received from a receiving Narrowband FSK Transceiver, the transmitting Narrowband FSK Transceiver may again increase the power level of the power amplifier 260. This may be repeated until an acknowledge is received, or the maximum power level of the power amplifier 260 is reached. A further discussion of this and other power management algorithms are described in co-pending U.S. patent application Ser. No. 09/311,250 filed May 13, 1999 entitled "Wireless System With Variable Learned-In Power".

A four-pin Serial Peripheral Interface (SPI) bus 262 is used to program the internal configuration registers of the control block 254, and access the transmit (Tx) FIFO 264 and the receive (Rx) FIFO 266. During a transmit operation, data bytes are written to the Tx FIFO 264 over the SPI bus 262. The controller block 254 reads the data from the Tx FIFO 264, and shifts the data serially with the addition of Start and Stop bits to VCO 212 for modulation. As indicated above, VCO 212 then provides the modulated signal to power amplifier 260, which drives the external antenna 214.

During a receive operation, the received signal is provided to LNA 220, down I-channel 240 and Q-channel 242 as described above, and finally to demodulator 250. The demodulated signal is then over-sampled to detect the Start and Stop bits for synchronization. After a complete byte is serially collected, including the corresponding Start and Stop bits, the byte is transferred to the Rx FIFO 266. The Controller block 254 senses when the Rx FIFO 266 has data, and sends an SPI interrupt signal on SPI bus 262, indicating that the Rx FIFO 266 is ready to be read by an external processor or the like (not shown).

Figure 2:
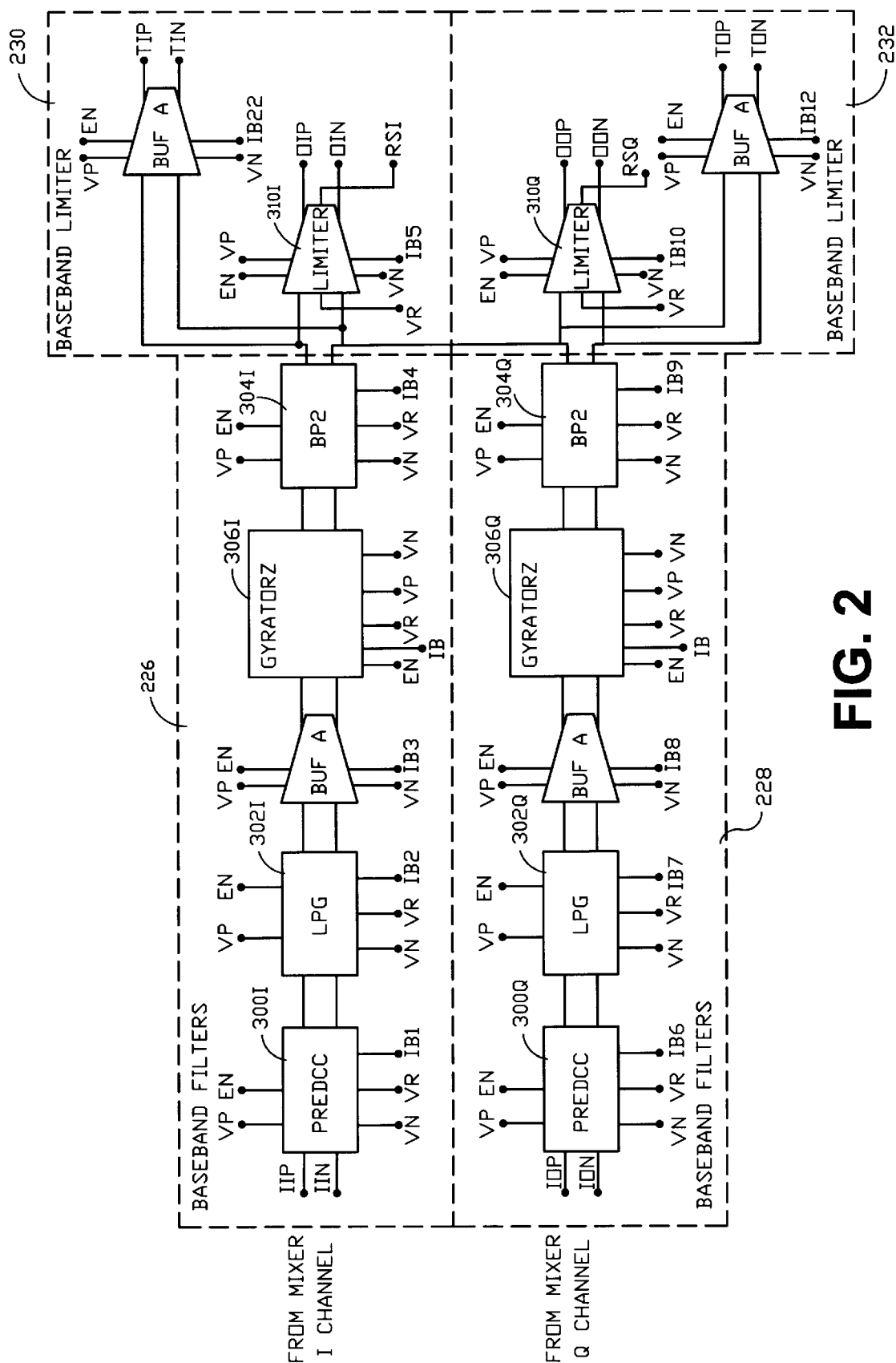
FIG. 2 is a block diagram of the baseband filters and baseband limiter blocks of FIG. 1.

FIG. 2 is a block diagram of the baseband filter block and baseband limiter block used in the I- and Q-channels of FIG. 1. As indicated above, the differential outputs of mixer 22 and mixer 224 of FIG. 1 are provided to two identical signal channels in quadrature phase, including I-channel 240 and the Q-channel 242. The I-channel 240 includes baseband filter block 226, followed by baseband limiter block 230. The Q-channel 242 includes baseband filter block 228, followed by baseband limiter block 232.

Referring now specifically to FIG. 2, each baseband filter block 226 and 228 includes a single pole low pass filter, a second order filter (with two near-DC high-pass poles and two wideband low-pass poles), and a gyrator filter. The PREDCC blocks 300I and 300Q include one of the near-DC high-pass poles and one of the wideband low pass poles of the second order filter. The LPG (Low Pass Gain) stages 302I and 302Q include the single pole low pass filter. The BP2 (Band Pass 2) stages 304I and 304Q include the other of the near-DC high-pass poles and the other of the wideband low pass poles of the second order filter. Finally, the GYRATORZ blocks 306I and 306Q include a differential gyrator-capacitor implementation of a 7-pole elliptic low-pass filter, as more fully described below.

Limiter blocks 230 and 232 preferably limit the amplitudes of the corresponding signals to remove the amplitude information before the signals are provided to the demodulator 250 of FIG. 1. Baseband limiter 230 includes differential limiter 310I, and baseband limiter 232 includes differential limiter 310Q. BUFA blocks 312I, 312Q, 314I and 314Q buffer the corresponding intermediate differential signals.

It is contemplated that the gain through the baseband filter blocks 226 and 228 and the Limiter Blocks 230 and 232 may exceed 1,000. In such high gain applications, it is often desirable to remove any DC offset from the differential input signal prior to amplification. In the present invention, the PREDCC blocks 300I and 300Q, the BP2 blocks 304I and 304Q, and the LIMITER blocks 310I and 310Q each include a DC offset cancellation circuit in accordance with the present invention. The DC offset cancellation circuit both actively provides a near-DC high-pass pole, and actively cancels out the DC offset before sending the signal to the next succeeding stage. This is desirable to prevent large out-of-band signals, such as DC offsets, from suppressing the wanted low level in-band signals.

Figure 3:
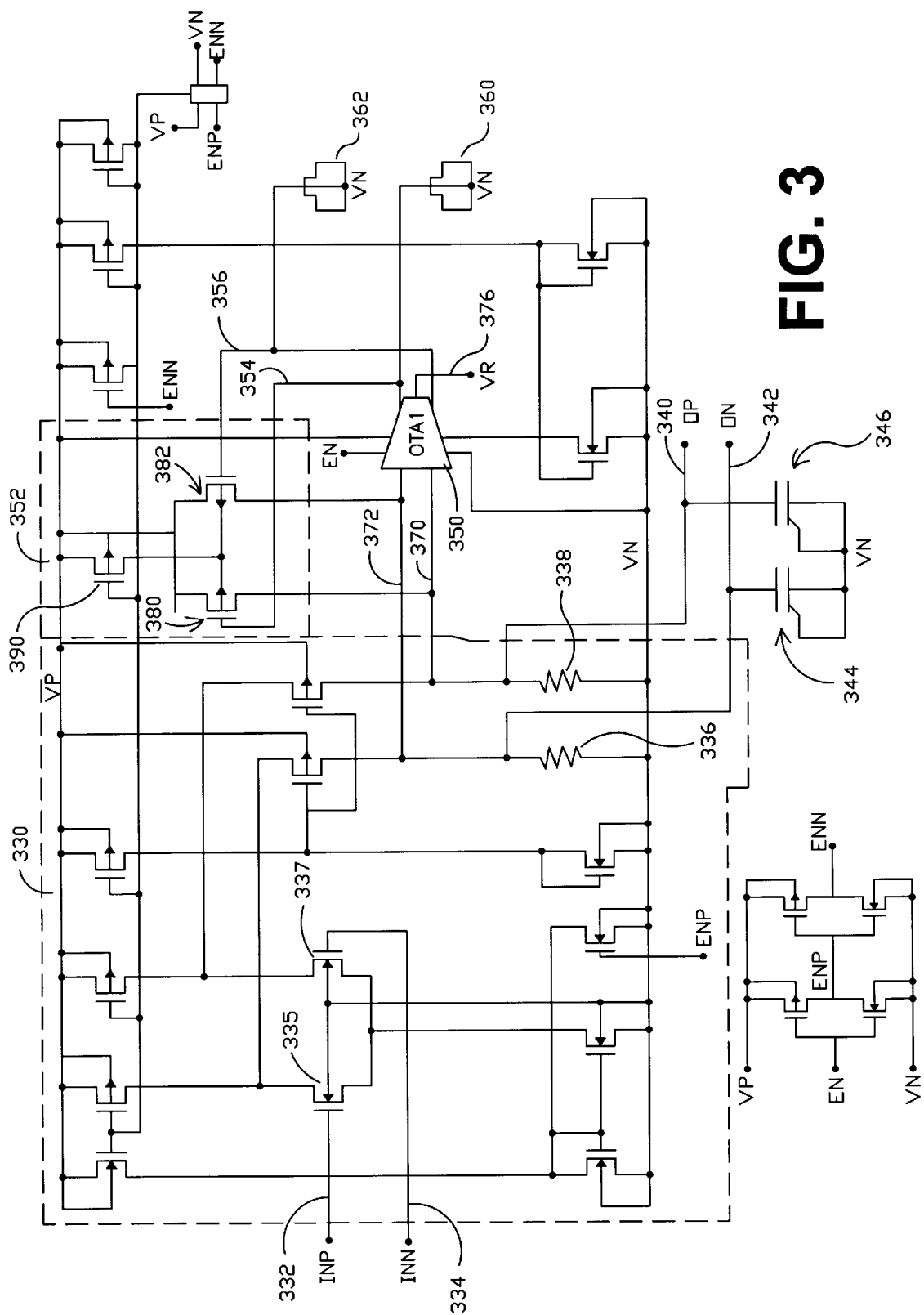
FIG. 3 is a schematic diagram of the PREDCC block of FIG. 2.

FIG. 3 is a schematic diagram of one of the PREDCC blocks of FIG. 2. The differential input signal is provided to a folded cascode input stage 330. The folded cascode input stage converts the differential input voltage on input terminals 332 and 334 into a differential current through load resistors 336 and 338. The gain of the input stage is determined by the value of the load resistors 336 and 338. The differential current through load resistors 336 and 338 produces a differential output voltage on output terminal 340 and 342. The input pair 335 and 337 of the folded cascode amplifier also provide "hyperbolic limiting" to help prevent the input stage 330 from becoming saturated when large input signals are provided by the mixer.

Capacitors 344 and 346 provide a wide-band low pass pole. The value of capacitors 344 and 346 determine the cut-off frequency of the low pass pole. The low pass pole provided by capacitors 344 and 346, the out-of-band signals are rejected before they are amplified.

To provide a near-DC high-pass pole (and DC offset rejection), differential amplifier 350 and offset circuit 352 are provided. The differential amplifier 350 samples the output of the folded cascode input stage 330, and provides differential control signals 354 and 356 to the offset circuit 352 as shown. The offset circuit 352 accepts the differential control signals 354 and 356, and provides enough current to the load resistors 336 and 338 to compensate for (i.e., zero out) the DC offset voltage at the input of the differential amplifier 350.

Load capacitors 360 and 362 are connected to each of the differential control signals 354 and 356. At low frequencies, the load capacitors 360 and 362 appear as opens, and the feedback path from the differential amplifier 350 to the offset circuit 352 remains relatively unencumbered. Thus, control signals 354 and 356 cause offset circuit 352 to provide offset currents that force the positive input port 370 and the negative input port 372 of the differential amplifier 350 to be substantially equal. As indicated above, this not only actively controls (e.g., eliminates) the DC offset between the positive and negative input ports 370 and 372, but also provides a high-pass pole.

As the frequency increases beyond the high-pass pole, the load capacitors 360 and 362 begin to appear as AC shorts to ground. This effectively prevents the AC control signals from reaching the offset circuit 352, and the offset circuit 352 provides the same offset current to the positive input port 370 and the negative input port 372. When this occurs, the differential amplifier 350 may provide a sufficient DC voltage to the offset circuit 352 so that the positive input port 370 and the negative input port 372 are centered about a reference voltage, such as reference voltage 376.

The offset circuit preferably includes a differential pair of transistors 380 and 382. The gate of differential transistor 380 is preferably connected to the positive output port 354 of the differential amplifier 350, and the gate of differential transistor 382 is preferably coupled to the negative output port 356 of the differential amplifier 350. The source terminals of the first and second differential transistors 380 and 382 are preferably coupled indirectly to VDD through a current mirror transistor 390. The drain of differential transistor 380 is preferably coupled to the positive input port 370 of the differential amplifier 350. The drain of differential transistor 382 is preferably coupled to the negative input port 372 of the differential amplifier 350. In this configuration, the differential control signals 354 and 356 control the offset currents provided by differential transistors 380 and 382 to the positive input port 370 and negative input port 372 of the differential amplifier 350.

Figure 4:
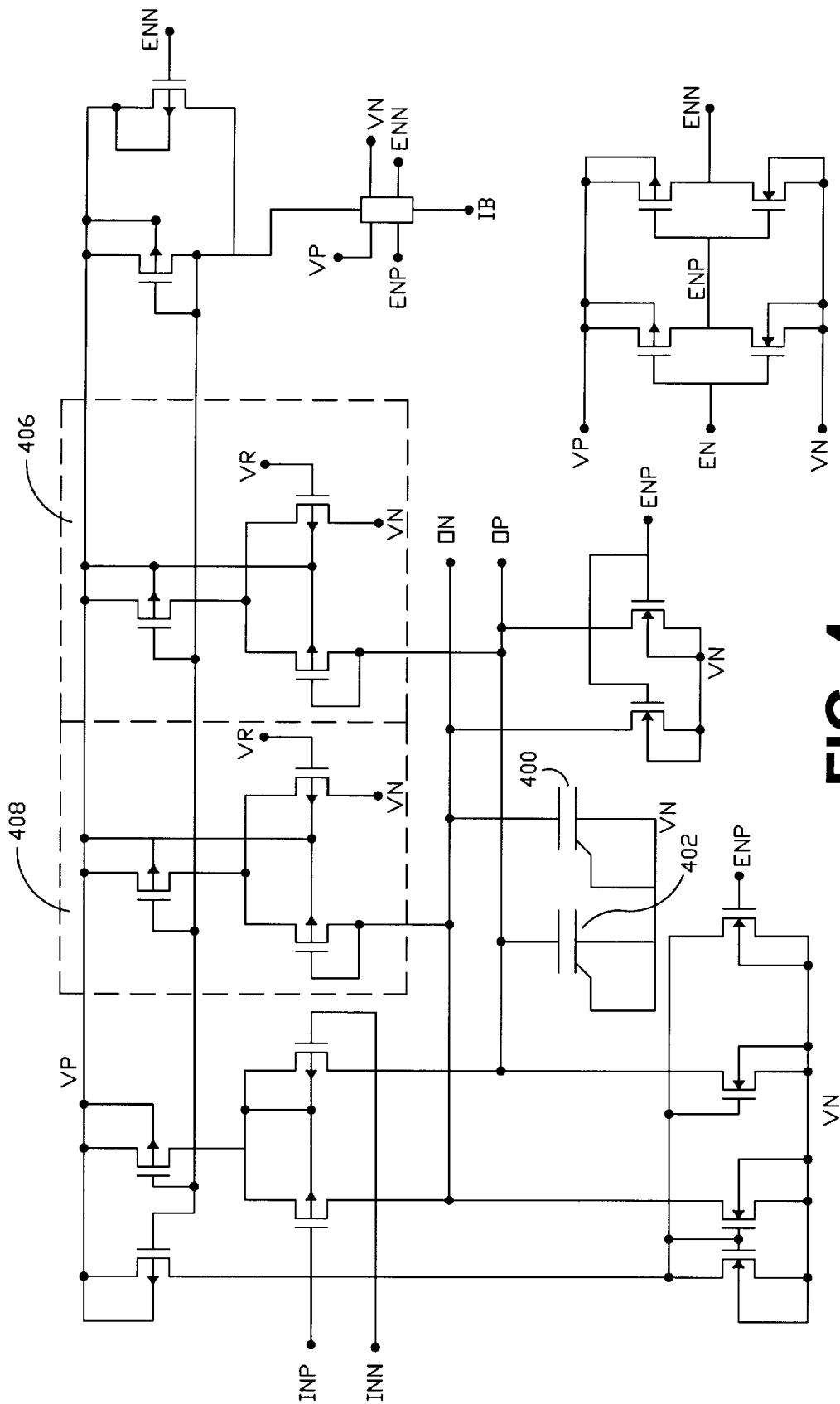
FIG. 4 is a schematic diagram of the LPG block of FIG. 2.

FIG. 4 is a schematic diagram of the LPG blocks of FIG. 2. The LPG blocks 302I and 302Q amplify the signal and provide a low pass pole. The LPG blocks 302I and 302Q are placed after the PREDCC blocks 300I and 300Q to maximize the dynamic range of the channel since the out-of-band signals will already have been rejected by the low and high-pass poles of the PREDCC blocks 300I and 300Q.

The impedance level of the LPG blocks 302I and 302Q are preferably higher than the PREDCC blocks 300I and 300Q. This helps reduce the capacitance values required, to obtain the desired low pass pole formed by capacitors 400 and 402, thereby reducing the area (cost) of the integrated circuit. The impedance level of the LPG blocks 302I and 302Q is raised by using linear transconductor loads 406 and 408, instead of polysilicon resistor loads 336 and 338 as shown in FIG. 3. The linear transconductor loads 406 and 408 can produce larger impedance levels in a smaller area than polysilicon resistors. Further, because the signal is now larger, the need for a linear load increases.

Figure 5:
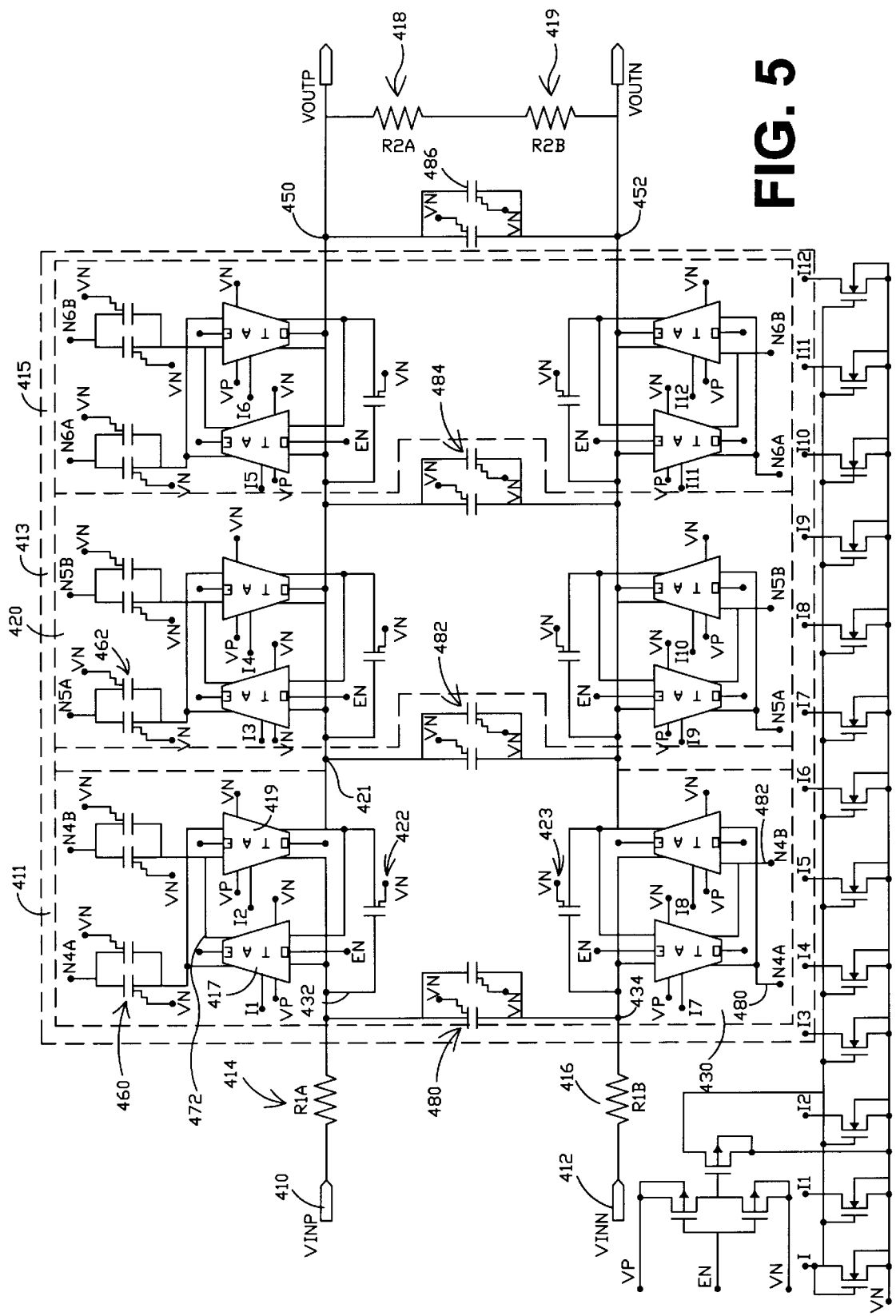
FIG. 5 is a schematic diagram of GYRATORZ block of FIG. 2.

FIG. 5 is a schematic diagram of the GYRATORZ blocks of FIG. 2. The differential gyrator based filter preferably includes a number of filter stages including filter stages 411, 413 and 415 connected in a cascaded configuration. Each filter stage preferably includes two gyrators: one for the positive input signal path and one for the negative input signal path. In filter stage 411, for example, gyrator 420 services the positive input signal path and gyrator 430 services the negative input signal path. Filter stages 413 and 415 are preferably similarly constricted.

Each gyrator preferably includes at least one load terminal, and preferably two load terminals. For example, gyrator 420 includes load terminals 470 and 472, and gyrator 430 includes load terminals 480 and 482. One or more load capacitors may then be connected between the load terminals of the corresponding gyrators 420 and 430. By connecting one or more load capacitors between gyrators, rather than providing a separate capacitor from each gyrator to ground, the overall capacitor area may be reduced. This is believed to increase the overall density, reliability, and yield of the gyrator based filter.

Gyrator 420 preferably includes a first differential amplifier 417 and a second differential amplifier 419. The positive input terminal of the first differential amplifier 417 and the negative output terminal of the second differential amplifier 419 are preferably coupled to the input terminal 432 of gyrator 420. The negative input terminal of the first differential amplifier 417 and the positive output terminal of the second differential amplifier 419 is preferably coupled to the output terminal 421 of gyrator 420.

The positive output terminal of the first differential amplifier 417 is preferably coupled to the positive input terminal of the second differential amplifier 419. Finally, the negative output terminal of the first differential amplifier 417 is preferably coupled to the negative input terminal of the second differential amplifier 419. Gyrator 430 may be similarly constructed.

As indicated above, because gyrators 420 and 430 are formed using two fully differential amplifiers, each gyrator may have two separate load terminals. For example, gyrator 420 includes load terminals 470 and 472, and gyrator 430 includes load terminals 480 and 482. To balance the load on each of the load terminals, the load capacitance preferably includes matched first and second capacitor loads 460 and 462, each having a first terminal and a second terminal. Load terminals 470 and 472 are preferably connected to the first terminals of the first and second capacitor loads 460 and 462, respectively, and load terminals 480 and 482 are preferably connected to the second terminals of the first and second capacitor loads 460 and 462, respectively.

It is contemplated that gyrators 420 and 430 may be used in conjunction with other impedance elements such as capacitors and resistors to complete each filter stage. In the embodiment shown, a first filter capacitor 422 is connected in parallel with gyrator 420 to form a parallel LC network. Likewise, a second filter capacitor 423 is connected in parallel with gyrator 430 to form another parallel LC network. A third filter capacitor 481 is connected between the input terminal 432 of gyrator 420 and input terminal 434 of gyrator 430. The remaining filter stages 413 and 415 are preferably similarly constructed.

Input resistors 414 and 416 provide a desired input impedance, and output resistors 418 and 419 provide a desired output or termination impedance. Finally, an output capacitor 486 is coupled between the output terminals 450 and 452 of the filter. Preferably, the overall gyrator filter provides a 7-pole elliptic low-pass filter.

Figure 6:
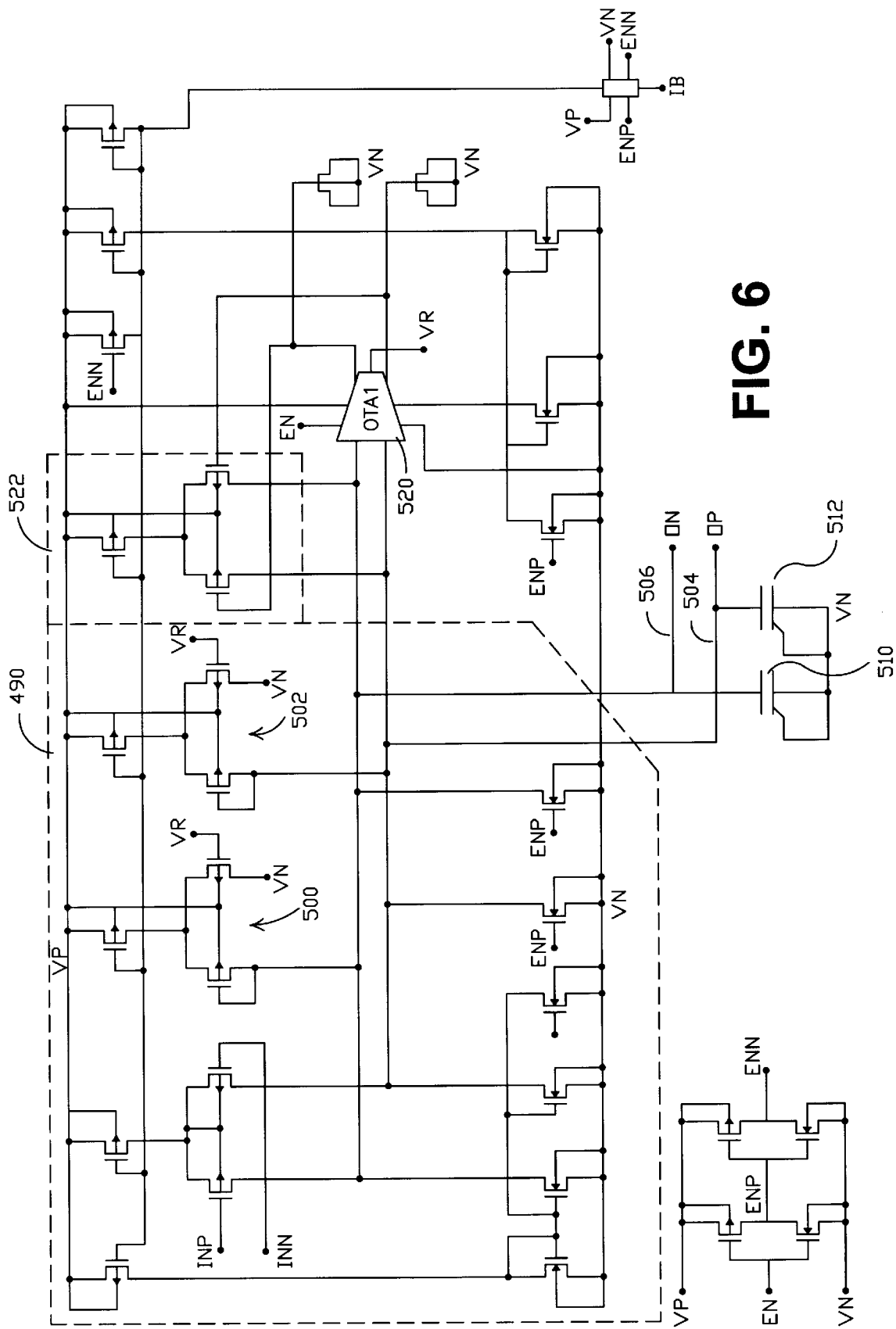
FIG. 6 is a schematic diagram of the BP2 block of FIG. 2.

FIG. 6 is a schematic diagram of the BP2 blocks of FIG. 2. The BP2 blocks 304I and 304Q are similar to the PREDCC blocks 300I and 300Q of FIG. 3. Each of the BP2 blocks 304I and 304Q have a folded cascode input stage 490 that amplifies the input signal. The gain of the input stage is primarily determined by the value of the linear transconductor loads 500 and 502. As indicated above, the linear transconductor loads 500 and 502 can produce larger impedance levels in a smaller area than polysilicon resistors. The differential current through linear transconductor loads 500 and 502 produces a differential output voltage on output terminals 504 and 506.

Capacitors 510 and 512 provide a wide-band low pass pole. The differential amplifier 520 and offset circuit 522 provide a near-DC high-pass pole and DC offset rejection, as further described above with reference to FIG. 3.

Figure 7:
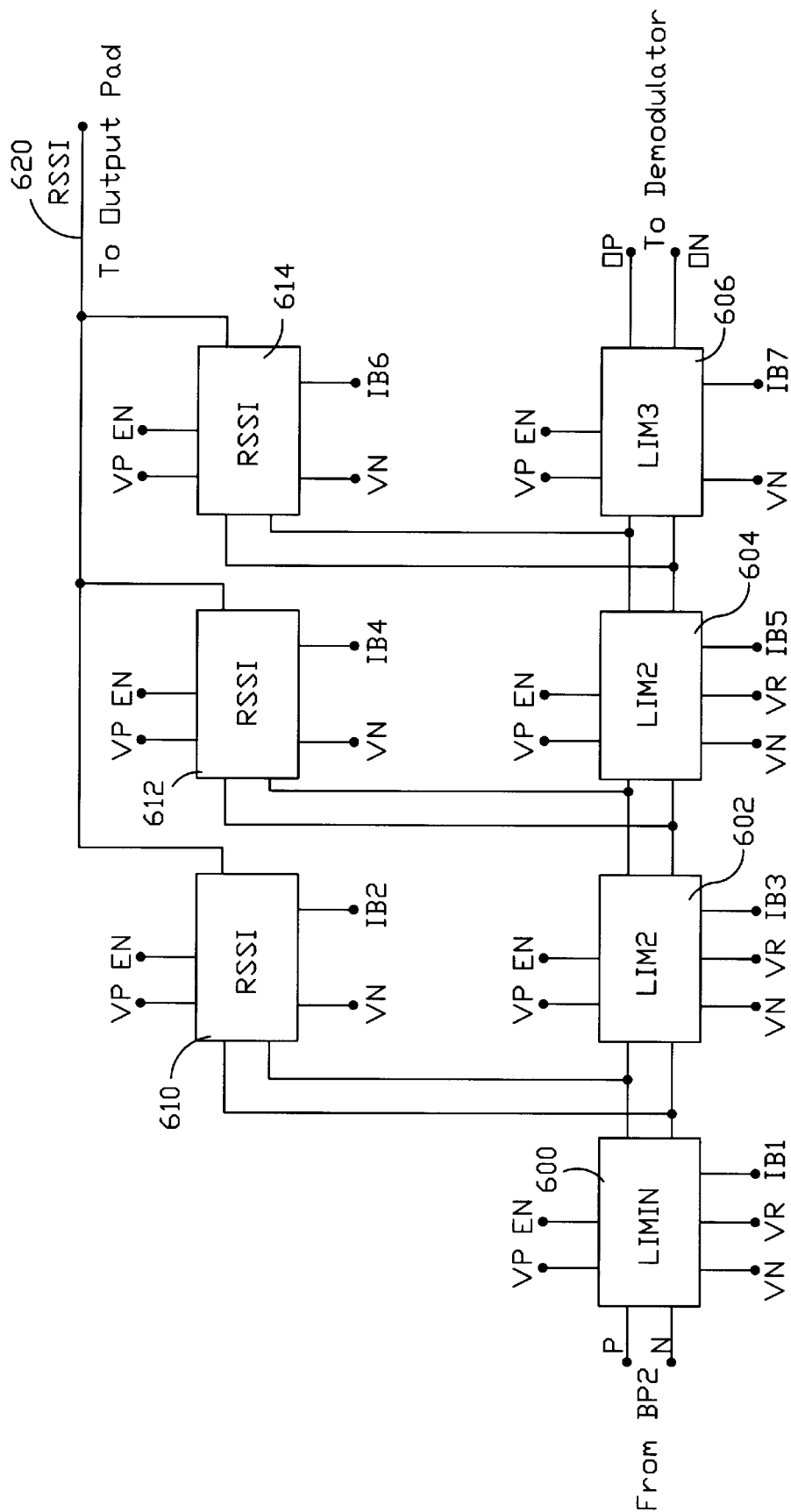
FIG. 7 is a schematic diagram of the LIMITER block of FIG. 2.

FIG. 7 is a schematic diagram of one of the Limiter blocks 230 and 232 of FIG. 2. The limiter blocks 230 and 232 each include a number of cascaded amplifier stages including LIMIN 600, LIM2 602, LIM2 604 and LfM3 606. Each amplifier stage amplifies the signal provided by the previous amplifier stage.

At least one of the limiter blocks 230 and 232 preferably contains an RSSI 18 (Receive Signal Strength Indicator) output that can be used for Forward-and-Reverse link power management for DSSS applications or for demodulating ASK (Amplitude Shift Key) or OOK (On Off Key) signals. One such power management approach is described in U.S. patent application Ser. No. 09/311,250 filed May 13, 1999, entitled "Wireless System With Variable Learned-In Transmit Power". The RSSI signal may also be used by AFC (Automatic Frequency Control frequency tracking) or AGC (Automatic Gain Control dynamic range enhancement), or both.

To generate the RSSI signal, an RSSI block may be connected to the output of each amplifier stage 600, 602 and 604 as shown. Each RSSI block provides an output signal that is proportional to the amplitude of the corresponding amplified input signal until the corresponding RSSI block becomes saturated, whereupon a relatively constant output signal is provided to the RSSI output signal 620.

The amplitude at the output terminals of the LIM2 stage 604 will normally be larger than the amplitude at the output terminals of the LIM2 stage 602. Likewise, the amplitude at the output terminals of the LIM2 stage 602 will normally be larger than the amplitude at the output terminals of the LIMIN stage 600. Therefore, the LIM2 stage 604 will likely be the first amplifier stage to significantly contribute to the RSSI output signal 620.

As the input signal to the LIMIN stage 600 increases in amplitude, the LIM2 stage 604 will eventually become saturated, and the LIM2 stage 602 will begin to significantly contribute to the RSSI output signal 620. Finally, as the input signal to the LIMIN stage 600 even further increases in amplitude, the LIM2 stage 602 will become saturated, and the LIMIN stage 600 will begin to significantly contribute to the RSSI output signal 620. This configuration allows the RSSI output signal 620 to provide a Receive Signal Strength Indicator over a wide range of signal strength values.

Figure 8:
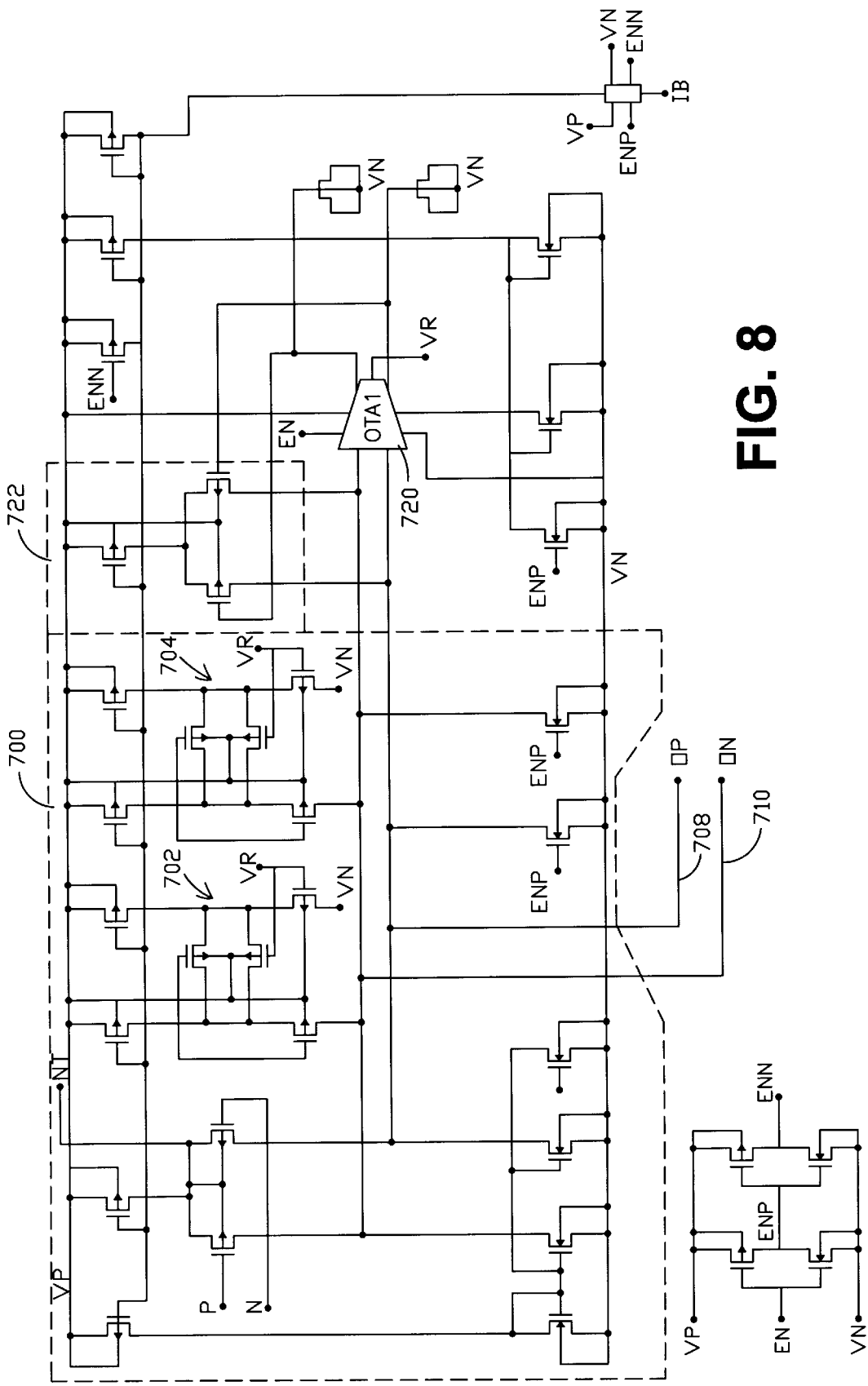
FIG. 8 is a schematic diagram of the LIMIN block of FIG. 7.

FIG. 8 is a schematic diagram of the LIMIN block of FIG. 7. The LIMIN block is similar to the PREDCC block of FIG. 3, and the BP2 block of FIG. 6. The LIMIN block 600 has a folded cascode input stage 700 that amplifies the input signal. The gain of the input stage 700 is determined by the value of the linear transconductor loads 702 and 704. The differential current through linear transconductor loads 702 and 704 produces a differential output voltage on output terminal 708 and 710. Differential amplifier 720 and offset circuit 722 provide a near-DC high-pass pole and DC offset rejection, as further described above with reference to FIG. 3 and FIG. 6.

Figure 9:
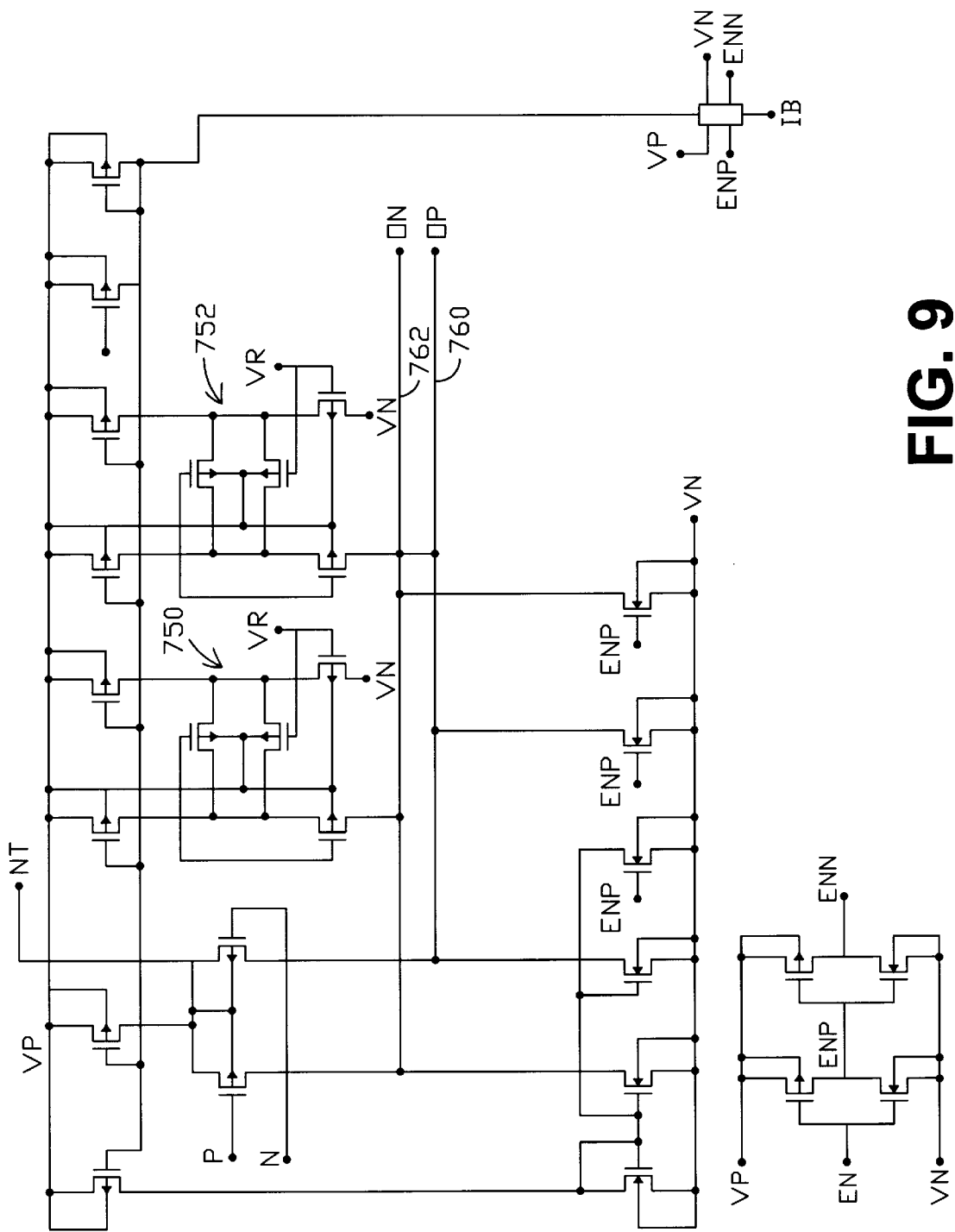
FIG. 9 is a schematic diagram of the LIM2 block of FIG. 7.

FIG. 9 is a schematic diagram of the LIM2 blocks 602 and 604 of FIG. 7. The LIM2 block has a folded cascode input stage that amplifies the input signal. The gain of the input stage is determined by the value of the linear transconductor loads 750 and 752. The differential current through linear transconductor loads 750 and 752 produces a differential output voltage on output terminals 760 and 762.

Figure 10:
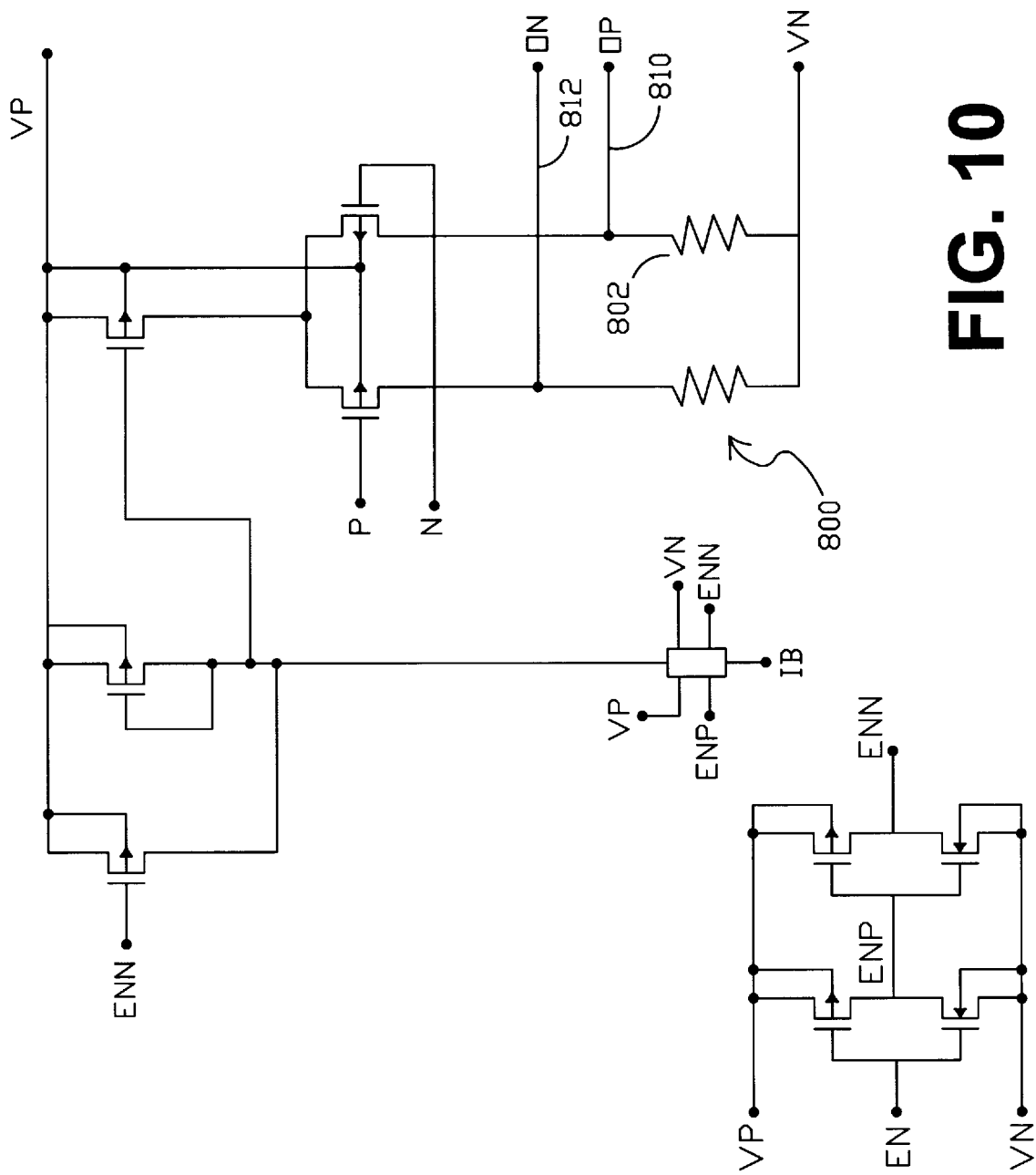
FIG. 10 is a schematic diagram of the LIM3 block of FIG. 7.

FIG. 10 is a schematic diagram of the LIM3 block 606 of FIG. 7. The LIM3 block 606 also has a differential input stage that directly amplifies the input signal. The gain of the input stage is determined by the value of the resistors 800 and 802. The differential current through resistors 800 and 802 produces a differential output voltage on output terminals 810 and 812.

Having thus described the preferred embodiments of the present invention, those of skill in the art will readily appreciate that the teachings found herein may be applied to yet other embodiments within the scope of the claims hereto attached.

What is claimed is:

1. A differential gyrator filter for receiving a differential mode input signal comprising:

load means having an admittance; and a differential gyrator having a positive input terminal and a negative input terminal with an input impedance therebetween for receiving the differential mode input signal, said differential gyrator coupled to said load means and providing an input impedance that is proportional to the admittance of said load means.

2. A differential filter having a positive filter input terminal and a negative filter input terminal, comprising:

first capacitance means having a first terminal and a second terminal;

second capacitance means having a first terminal and a second terminal;

first gyrator means having an input terminal and a load terminal, the input terminal of the first gyrator means coupled to the positive filter input terminal of the filter, and the load terminal of the first gyrator means coupled to the first terminal of said first capacitance means; and second gyrator means having an input terminal and a load terminal, the input terminal of the second gyrator means coupled to the negative filter input terminal of the filter, and the load terminal of the second gyrator means coupled to the first terminal of said second capacitance means;

said second terminal of said first capacitance means and said second terminal of said second capacitance means coupled to a reference voltage.

3. A differential filter according to claim 2, wherein the reference voltage is ground.

4. A differential filter having a positive filter input terminal and a negative filter input terminal, comprising:

capacitance means having a first terminal and a second terminal;

first gyrator means having an input terminal and a load terminal, the input terminal of the first gyrator means coupled to the positive filter input terminal of the filter, and the load terminal of the first gyrator means coupled to the first terminal of said capacitance means; and second gyrator means having an input terminal and a load terminal, the input terminal of the second gyrator means coupled to the negative filter input terminal of the filter, and the load terminal of the second gyrator means coupled to the second terminal of said capacitance means.

5. A filter according to claim 4, wherein the first gyrator means includes:

a first differential amplifier having a positive input terminal, a negative input terminal, a positive output terminal and a negative output terminal;

a second differential amplifier having a positive input terminal, a negative input terminal, a positive output terminal and a negative output terminal;

the positive input terminal of the first differential amplifier of the first gyrator means and the negative output terminal of the second differential amplifier of the first gyrator means are coupled to the input terminal of the first gyrator means;

the negative input terminal of the first differential amplifier of the first gyrator means is coupled to the positive output terminal of the second differential amplifier of the first gyrator means;

the positive output terminal of the first differential amplifier of the first gyrator means is coupled to the positive input terminal of the second differential amplifier of the first gyrator means; and the negative output terminal of the first differential amplifier of the first gyrator means is coupled to the negative input terminal of the second differential amplifier of the first gyrator means.

6. A filter according to claim 5, wherein said capacitance means includes:

a first capacitor having a first terminal and a second terminal; and a second capacitor having a first terminal and a second terminal.

7. A filter according to claim 6, wherein the positive output terminal of the first differential amplifier of the first gyrator means and the positive input terminal of the second differential amplifier of the first gyrator means are coupled to the first terminal of the first capacitor.

8. A filter according to claim 7, wherein the negative output terminal of the first differential amplifier of the first gyrator means and the negative input terminal of the second differential amplifier of the first gyrator means are coupled to the first terminal of the second capacitor.

9. A filter according to claim 8, wherein the second gyrator means includes:

a first differential amplifier having a positive input terminal, a negative input terminal, a positive output terminal and a negative output terminal;

a second differential amplifier having a positive input terminal, a negative input terminal, a positive output terminal and a negative output terminal;

the positive input terminal of the first differential amplifier of the second gyrator means and the negative output terminal of the second differential amplifier of the second gyrator means are coupled to the input terminal of the second gyrator means;

the negative input terminal of the first differential amplifier of the second gyrator means is coupled to the positive output terminal of the second differential amplifier of the second gyrator means;

the positive output terminal of the first differential amplifier of the second gyrator means is coupled to the positive input terminal of the second differential amplifier of the second gyrator means; and the negative output terminal of the first differential amplifier of the second gyrator means is coupled to the negative input terminal of the second differential amplifier of the second gyrator means.

10. A filter according to claim 9, wherein the positive output terminal of the first differential amplifier of the second gyrator means and the positive input terminal of the second differential amplifier of the second gyrator means are coupled to the second terminal of the first capacitor.

11. A filter according to claim 10, wherein the negative output terminal of the first differential amplifier of the second gyrator means and the negative input terminal of the second differential amplifier of the second gyrator means are coupled to the second terminal of the second capacitor.

12. A filter according to claim 11, further comprising a positive filter output terminal and a negative filter output terminal.

13. A filter according to claim 12, wherein the negative input terminal of the first differential amplifier of the first gyrator means and the positive output terminal of the second differential amplifier of the first gyrator means are coupled to the positive filter output terminal.

14. A filter according to claim 13, wherein the negative input terminal of the first differential amplifier of the second gyrator means and the positive output terminal of the second differential amplifier of the second gyrator means are coupled to the negative filter output terminal.

15. A filter according to claim 14, further comprising a first filter capacitor element coupled between the input terminal of the first gyrator means and the positive filter output terminal of the filter.

16. A filter according to claim 15, further comprising a second capacitor element coupled between the input terminal of the second gyrator means and the negative filter output terminal of the filter.

17. A filter according to claim 16, further comprising a third capacitor element coupled between the input terminal of the first gyrator means and the input terminal of the second gyrator means.

18. A filter according to claim 16, further comprising a fourth capacitor element coupled between the positive filter output terminal and the negative filter output terminal.

19. A filter according to claim 18, further comprising:
    a first resistor element coupled between the positive filter input terminal and the input terminal of the first gyrator means; and
    a second resistor element coupled between the negative filter input terminal and the input terminal of the second gyrator means.

20. A filter having a number of cascaded filter stages, wherein each filter stage has a positive filter input terminal and a negative filter input terminal, each filter stage comprising:
    one or more capacitors, each having a first terminal and a second terminal;
    a first gyrator having an input terminal, an output terminal and one or more load terminals, the input terminal of the first gyrator coupled to the positive filter input terminal of the corresponding filter stage, and the one or more load terminals of the first gyrator coupled to the first terminals of the one or more capacitors;
    a second gyrator having an input terminal, an output terminal and one or more load terminals, the input terminal of the second gyrator coupled to the negative filter input terminal of the corresponding filter stage, and the one or more load terminals of the second gyrator coupled to the second load terminals of the one or more capacitors; and
    the output terminal of the first gyrator and the output terminal of the second gyrator being coupled to the positive filter input terminal and the negative filter input terminal, respectively, of the next succeeding filter stage.

21. A filter according to claim 20, wherein each filter stage further includes a first filter capacitor element coupled between the input terminal of the first gyrator and the positive filter input terminal of the next succeeding filter stage, and a second filter capacitor element coupled between the input terminal of the second gyrator and the negative filter input terminal of the next succeeding filter stage.

22. A filter according to claim 21, wherein each filter stage further includes a third capacitor element coupled between the input terminal of the first gyrator and the input terminal of the second gyrator.

23. A filter according to claim 22, further comprising:
    a first resistor element coupled between the positive filter input terminal of a first filter stage and the input terminal of the first gyrator; and
    a second resistor element coupled between the negative filter input terminal of the first filter stage and the input terminal of the second gyrator.

24. A filter according to claim 23, further comprising a third resistor element coupled between the output terminal of the first gyrator and the output terminal of the second gyrator of a last filter stage.

25. A filter according to claim 23, wherein the filter is fabricated using a CMOS process.

26. A differential filter having a positive filter input terminal and a negative filter input terminal, comprising:
    capacitance means having a first terminal and a second terminal; first gyrator means having an input terminal and a load terminal, the input terminal of the first gyrator means coupled to the positive filter input terminal of the filter, and the load terminal of the first gyrator means coupled to the first terminal of said capacitance means, said first gyrator means including:
    a first differential amplifier having a positive input terminal, a negative input terminal, a positive output terminal and a negative output terminal;
    a second differential amplifier having a positive input terminal, a negative input terminal, a positive output terminal and a negative output terminal;
    the positive input terminal of the first differential amplifier of the first gyrator means and the negative output terminal of the second differential amplifier of the first gyrator means are coupled to the input terminal of the first gyrator means;
    the negative input terminal of the first differential amplifier of the first gyrator means is coupled to the positive output terminal of the second differential amplifier of the first gyrator means;
    the positive output terminal of the first differential amplifier of the first gyrator means is coupled to the positive input terminal of the second differential amplifier of the first gyrator means;
    the negative output terminal of the first differential amplifier of the first gyrator means is coupled to the negative input terminal of the second differential amplifier of the first gyrator means;
    second gyrator means having an input terminal and a load terminal, the input terminal of the second gyrator means coupled to the negative filter input terminal of the filter, and the load terminal of the second gyrator means coupled to the second terminal of said capacitance means, said second gyrator means including:
    a first differential amplifier having a positive input terminal, a negative input terminal, a positive output terminal and a negative output terminal;
    a second differential amplifier having a positive input terminal, a negative input terminal, a positive output terminal and a negative output terminal;
    the positive input terminal of the first differential amplifier of the second gyrator means and the negative output terminal of the second differential amplifier of the second gyrator means are coupled to the input terminal of the second gyrator means;

the negative input terminal of the first differential amplifier of the second gyrator means is coupled to the positive output terminal of the second differential amplifier of the second gyrator means;

the positive output terminal of the first differential amplifier of the second gyrator means is coupled to the positive input terminal of the second differential amplifier of the second gyrator means; and the negative output terminal of the first differential amplifier of the second gyrator means is coupled to the negative input terminal of the second differential amplifier of the second gyrator means.

27. A filter according to claim 26, wherein said capacitance means includes:

a first capacitor having a first terminal and a second terminal; and a second capacitor having a first terminal and a second terminal.

28. A filter according to claim 27, wherein:

the positive output terminal of the first differential amplifier of the first gyrator means and the positive input terminal of the second differential amplifier of the first gyrator means are coupled to the first terminal of the first capacitor;

the negative output terminal of the first differential amplifier of the first gyrator means and the negative input terminal of the second differential amplifier of the first gyrator means are coupled to the first terminal of the second capacitor;

the positive output terminal of the first differential amplifier of the second gyrator means and the positive input terminal of the second differential amplifier of the second gyrator means are coupled to the second terminal of the first capacitor; and the negative output terminal of the first differential amplifier of the second gyrator means and the negative input terminal of the second differential amplifier of the second gyrator means are coupled to the second terminal of the second capacitor.

29. A differential filter having a positive filter input terminal and a negative filter input terminal comprising:

capacitance means having at least two first terminals and at least two second terminal;

first gyrator means having an input terminal and at least two load terminals, the input terminal of the first gyrator means coupled to the positive filter input terminal of the filter, and each of the at least two load terminals of the first gyrator means coupled to a corresponding one of the at least two first terminals of said capacitance means; and second gyrator means having an input terminal and at least two load terminals, the input terminal of the second gyrator means coupled to the negative filter input terminal of the filter, and each of the at least two load terminals of the second gyrator means coupled to a corresponding one of the at least two second terminals of said capacitance means.

* * * * *